(12) United States Patent
Wang et al.

(10) Patent No.: US 11,486,053 B2
(45) Date of Patent: Nov. 1, 2022

(54) METHOD FOR RAPID GROWTH OF LONG SEED KDP-TYPE CRYSTALS

(71) Applicant: Shanghai Institute of Optics And Fine Mechanics, Chinese Academy of Sciences, Shanghai (CN)

(72) Inventors: Bin Wang, Shanghai (CN); Hongji Qi, Shanghai (CN); Jianda Shao, Shanghai (CN); Duanyang Chen, Shanghai (CN)

(73) Assignee: Shanghai Institute of Optics And Fine Mechanics, Chinese Academy of Sciences, Shanghai (CN)

( * ) Notice: Subject to any disclaimer, the term of this patent is extended or adjusted under 35 U.S.C. 154(b) by 2 days.

(21) Appl. No.: 17/159,106

(22) Filed: Jan. 26, 2021

(65) Prior Publication Data

US 2021/0148003 A1 May 20, 2021

Related U.S. Application Data

(63) Continuation of application No. PCT/CN2020/076923, filed on Feb. 27, 2020.

(30) Foreign Application Priority Data

Apr. 10, 2019 (CN) .......................... 201910283598.2

(51) Int. Cl.
*C30B 7/08* (2006.01)
*G02F 1/35* (2006.01)
(Continued)

(52) U.S. Cl.
CPC ................ *C30B 7/08* (2013.01); *C30B 29/14* (2013.01); *G02F 1/354* (2021.01); *G02F 1/3551* (2013.01)

(58) Field of Classification Search
CPC .. C30B 7/08; C30B 29/14; C30B 7/10; G02F 1/354; G02F 1/355
See application file for complete search history.

(56) References Cited

U.S. PATENT DOCUMENTS

| 5,904,772 A | * | 5/1999 | Montgomery | ............ | C30B 7/08 |
| | | | | | 117/206 |
| 10,934,632 B2 | * | 3/2021 | Vissie | ....................... | C30B 7/14 |

(Continued)

FOREIGN PATENT DOCUMENTS

| CN | 103361712 A | 10/2013 |
| CN | 105088343 A | 11/2015 |

(Continued)

OTHER PUBLICATIONS

Andrew Yeckel et al., "Three-dimensional computations of solution hydrodynamics during the growth of potassium dihydrogen phosphate II. Spin down," Journal of Crystal Growth, vol. 191, pp. 206-224 (1998).

*Primary Examiner* — Robert M Kunemund
(74) *Attorney, Agent, or Firm* — Mei & Mark LLP; Manni Li

(57) ABSTRACT

A pyramidal growth method for long-seed KDP-type crystal. In the growth method provided by the present invention, the lower end of the long-seed crystal is restricted by a lower tray, and the upper end is free to grow into a pyramidal. At the same time, the four prismatic faces at two directions of [100] and [010] can grow, avoiding growth stress problem during crystal growth, and all cut optical elements have high optical quality. Because the growth process is that four prismatic faces with highly similar growth environments grow at the same time and stirring is applied by blade-like stirring paddles during the crystal growth process, the cut optical elements have high optical uniformity.

4 Claims, 3 Drawing Sheets

(51) Int. Cl.
*C30B 29/14* (2006.01)
*G02F 1/355* (2006.01)

(56) References Cited

U.S. PATENT DOCUMENTS

| | | | | |
|---|---|---|---|---|
| 2004/0011278 | A1* | 1/2004 | Tatartchenko | C30B 7/00 |
| | | | | 117/1 |
| 2014/0234677 | A1* | 8/2014 | Yoon | H01M 50/20 |
| | | | | 429/89 |
| 2019/0136403 | A1* | 5/2019 | Qi | C30B 29/60 |

FOREIGN PATENT DOCUMENTS

| | | |
|---|---|---|
| CN | 105256377 A | 1/2016 |
| CN | 105603525 A | 5/2016 |
| CN | 107326438 A | 11/2017 |
| CN | 108680106 A | 10/2018 |
| CN | 109943881 A | 6/2019 |

* cited by examiner

METHOD FOR RAPID GROWTH OF LONG SEED KDP-TYPE CRYSTALS

CROSS-REFERENCE TO RELATED APPLICATIONS

The subject application is a continuation of PCT/CN2020/076923 filed on Feb. 27, 2020, which claims priority on Chinese Application No. CN201910283598.2 filed on Apr. 10, 2019 in China. The contents and subject matter of the PCT international application and Chinese priority application are incorporated herein by reference.

TECHNICAL FIELD

The present invention relates to a KDP-type crystal, in particular, a pyramidal growth method for long-seed KDP-type crystal which aims to rapidly grow KDP-type crystals with high cutting efficiency and small growth stress.

BACKGROUND ART

Potassium dihydrogen phosphate/potassium dideuterium phosphate (KDP/DKDP) crystal materials are widely used in the fabrication of second harmonic generation and electro-optic devices due to their large nonlinear optical coefficient, wide transmission band, and excellent optical uniformity. Laser inertial confinement fusion (ICF) devices in various countries require a large number of KDP-type crystals with high quality and large diameter; the KDP crystal is used as an optical switch and a second harmonic generation element, and the DKDP crystal is used as a third harmonic generation element. However, the KDP-type crystals grown by the existing technology mainly has the defects of poor crystal quality, low aspect ratio etc., which further causes the KDP-type crystal to be low in cutting efficiency, prone to have a prism-pyramidal interface, and the quality of the prism-pyramidal interface part of the crystal is poor, which is the shortcoming that restricts the overall quality of crystal. Chinese Patent Application CN201210102338.9, which is published as Chinese Patent Application Publication No. CN103361712A, describes a crystal carrier for large-section KDP-type crystal growth and a growth method. According to the crystal carrier provided by the disclosure, the upper transverse plate and the lower transverse plate are of plate-type structures, and the crystal growth solution can be greatly disturbed in the process of crystal growth rotation, which reducing the crystal quality. According to the disclosure, the seed crystal is fixed on the center of the lower surface of the upper transverse plate or the upper surface of the lower transverse plate, but only rotation is applied during the crystal growth without stirring, causing an uneven crystal growth; and when the crystal grows to contact with the other transverse plate, collision contact between the crystal and the transverse plate can occur, leading to hybrid crystal growth. Chinese Patent Application No. CN201710987729.6, which is published as Chinese Patent Application Publication No. CN107805844A, introduces a limited growth method for long-seed KDP-type crystal, wherein the growth stress is large because the seed crystal is propped at both the top and bottom during the growth process, causing growth difficulty; and the height of the seed crystal required to be provided is large, which increasing the difficulty of crystal growth.

SUMMARY OF THE INVENTION

To overcome the problems of the existing KDP-type crystal growth, the present invention provides a pyramidal growth method for long-seed KDP-type crystal. The method is favorable for rapidly growing KDP-type crystals under low growth stress; during the growth process, except the upper end which is a free pyramidal-forming growth, all growth faces are prismatic faces, and the growth environment of each face is highly similar, with higher optical uniformity. Further, a KDP-type crystal element without a prism-pyramidal interface can be cut out from the prismatic face, and the KDP-type crystal obtained by the method of the present invention has high cutting efficiency when the third harmonic generation element is cut.

The present invention provides a method for growing pyramidal long-seed KDP-type crystal, comprising:

(1) manufacturing a growth tank for crystal growth, wherein a motor is arranged at an upper part of the growth tank, and a connecting rod of a crystal carrier is connected to a lower end of a rotating shaft of the motor;

(2) manufacturing the crystal carrier for crystal growth, wherein the crystal carrier comprises an upper cross beam, a lower tray, the connecting rod, supporting side rods, and two blade-like stirring paddles; the connecting rod is fixed at a center of the upper cross beam; lower ends of the supporting side rods are fixed at two ends of the lower tray with same diameter, and upper ends of the supporting side rods are fixed at two ends of the upper cross beam; the blade-like stirring paddles are of blade-like structures fixed on the supporting side rods; the two blade-like stirring paddles, the supporting side rod, s and the upper cross beam are arranged on the same vertical plane; center of upper surface of the lower tray is a fixed position of a long-seed crystal; and all joints are smoothly connected to ensure smoothness;

(3) manufacturing the long-seed crystal with [001] direction in height direction, wherein height of the long-seed crystal is smaller than height of the supporting side rods of the crystal carrier, and horizontal length and width range of the long-seed crystal are 5-15 mm;

(4) mounting the lower end surface of the long-seed crystal in the center of the upper surface of the lower tray of the crystal carrier;

(5) preparing a crystal growth solution with a saturation point of 40 to 70° C.;

(6) placing the crystal carrier mounted with the long-seed crystal into an oven for preheating for 4 to 12 hours, wherein preheating temperature is the saturation point temperature of the growth solution;

(7) placing the crystal carrier mounted with the long-seed crystal into the prepared growth solution, connecting the connecting rod of the crystal carrier to a rotating shaft of the motor, starting the motor, and setting a rotating speed range to be 10-50 rpm, wherein the rotation mode adopts a cycle of forward rotation 25 s-deceleration 2 s-stop 1 s-reverse acceleration 2 s-reverse rotation 25 s-deceleration 2 s-stop 1 s-forward acceleration 2 s, and s represents second; and (8) heating the growth solution to 5 to 15° C. above the saturation point temperature for superheating treatment to completely dissolve but not breaking the four side surfaces of the long-seed crystal, cooling to allow the supersaturation degree of the growth solution to be between 5-15%, thereby realizing the pyramidal growth of the crystal on the long-seed crystal and obtaining the KDP-type crystal.

Further, the KDP-type crystal is a KDP crystal or a DKDP crystal.

In step (2), the upper cross beam is a smooth-edged batten, the connecting rod is a hollow round rod, and the lower tray is a round plate.

In step (2), the fixing mode is welding.

The present invention has the following technical effects:

In the pyramidal growth method for the long-seed KDP-type crystal of the present invention, the lower end of the long-seed crystal is restricted by a lower tray, and the upper end is free to grow into a pyramidal. At the same time, the four prismatic faces at two directions of [100] and [010] can grow, avoiding growth stress problem during crystal growth, and all cut optical elements have high optical quality. Because the growth process has four prismatic faces with highly similar growth environments growing at the same time and stirring is applied by the blade-like stirring paddle during the crystal growth process, the cut optical elements have high optical uniformity. Due to the unique characteristic of the cutting angle of the KDP crystal third harmonic generation element, the crystal grown by the method of the present invention has high cutting efficiency when the third harmonic generation element is cut, and the area of the largest third harmonic generation element capable of being cut can be known in advance through the size of the horizontal size of the grown crystal.

BRIEF DESCRIPTION OF THE DRAWINGS

FIG. 3A shows the assembly of the blade-like stirring paddle and supporting side rods; FIG. 3B shows the front view of the blade-like stirring paddle; FIG. 3C shows the left view of the blade-like stirring paddle; FIG. 3D shows the shows the right view of the blade-like stirring paddle; and FIG. 3E shows the top view of the supporting side rod used in the method of the present invention.

Figure 1:
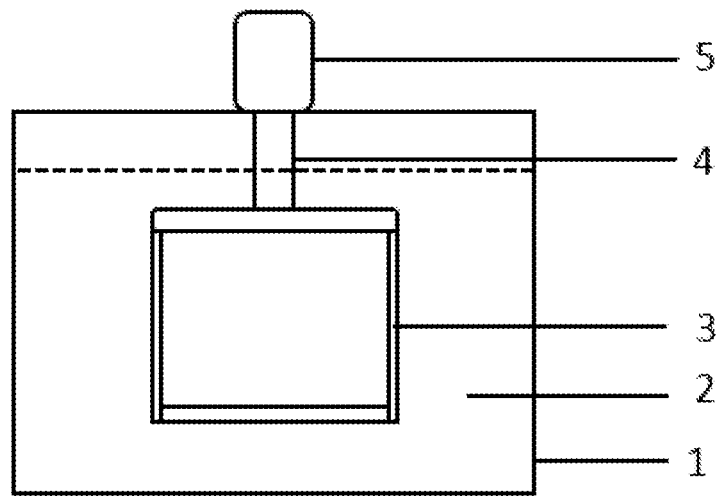
FIG. 1 shows the assembly of the growth tank and the crystal carrier used in the pyramidal growth method for long-seed KDP-type crystal of the present invention.
Figure 2:
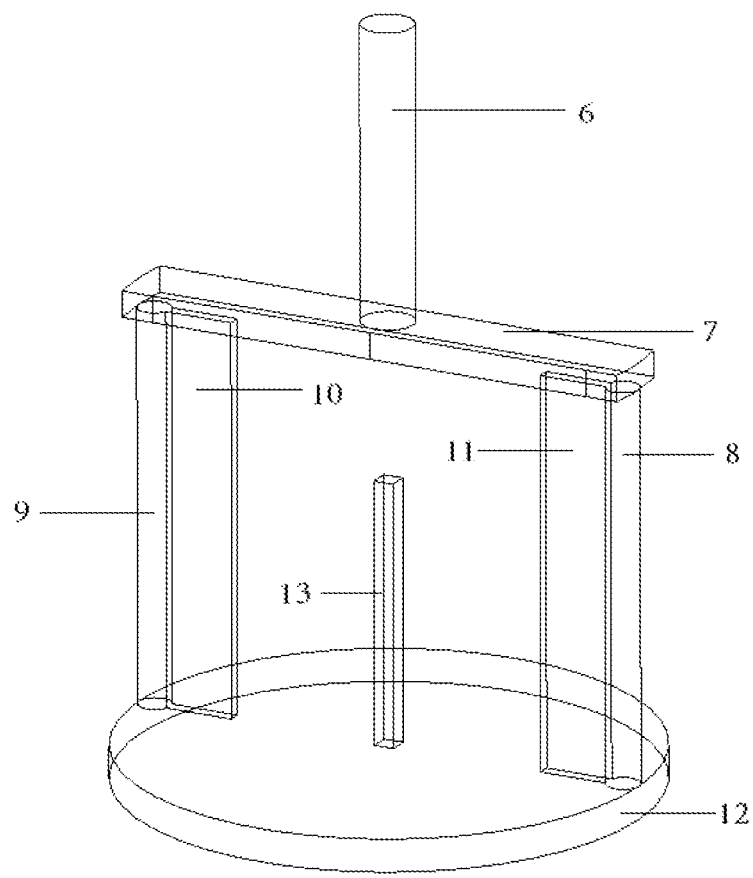
FIG. 2 shows the crystal carrier used in the pyramidal growth method for long-seed KDP-type crystal of the present invention.
Figures 3A, 3B, 3C:
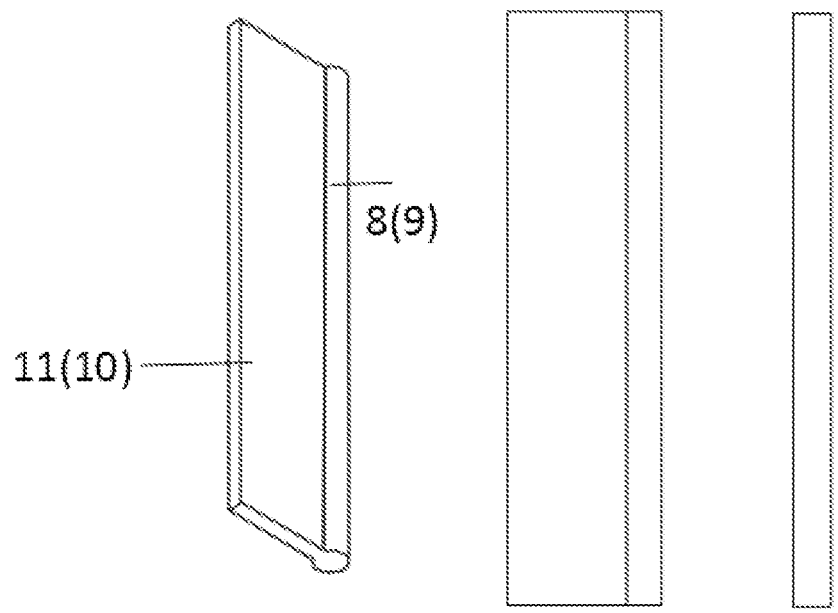
FIG. 3A to 3E show the blade-like stirring paddle and supporting side rods used in the pyramidal growth method for long-seed KDP-type crystal of the present invention, where
Figures 3D, 3E:
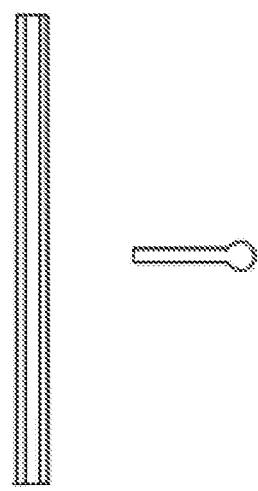

Reference numerals used in the figures refer to the following structure: 1—growth tank; 2—growth solution; 3—crystal carrier; 4—rotating shaft; 5—motor; 6—connecting rod; 7—upper cross beam; 8—supporting side rod; 9—supporting side rod; 10—blade-like stirring paddle; 11—blade-like stirring paddle; 12—lower tray, 13—long-seed crystal; 14—KDP-type crystal; 15—third harmonic generation element.

DETAILED DESCRIPTION OF THE INVENTION

The present invention is described in detail through embodiments in conjunction with the drawings, but they should not be used to limit the scope of the present invention.

Example 1: Pyramidal Growth for Long-Seed KDP Crystal

The pyramidal growth for a long-seed KDP crystal includes the following steps as shown in FIGS. 1, 2 and 3A to 3E:

(1) manufacturing a growth tank 1 for crystal growth, wherein a motor 5 is arranged at the upper part of the growth tank 1, and a connecting rod 6 of a crystal carrier 3 is connected to a lower end of a rotating shaft 4 of the motor 5;

(2) manufacturing the crystal carrier 3 for crystal growth: wherein the crystal carrier 3 comprises an upper cross beam 7, a lower tray 12, the connecting rod 6, supporting side rods 8 and 9, and two blade-like stirring paddles 10 and 11; the upper cross beam 7 is a smooth-edged batten; the connecting rod 6 is a hollow round rod fixed at the center of the upper cross beam 7; the lower tray 12 is round plate; lower ends of the supporting side rods 8 and 9 are welded at two ends of the lower tray 12 with the same diameter, and upper ends of the supporting side rods 8 and 9 are welded at two ends of the upper cross beam 7; the blade-like stirring paddles 10 and 11 are of blade-like structures welded on the supporting side rods 8 and 9; the two blade-like stirring paddles 10 and 11, the supporting side rods 8 and 9 and the upper cross beam 7 are arranged on the same vertical plane; the center of the upper surface of the lower tray 12 is a fixed position of the long-seed crystal; and all joints are smoothly connected to ensure smoothness;

(3) manufacturing a long-seed KDP crystal 13 with [001] in height direction: wherein the height of the long-seed KDP crystal 13 is smaller than the height of the supporting side rods 8 and 9 of the crystal carrier 3, and the horizontal length and the width range of the long-seed KDP crystal 13 are 5 mm;

(4) mounting the lower end surface of the long-seed KDP crystal 13 in the center of the upper surface of the lower tray 12 of the crystal carrier 3;

(5) preparing a KDP crystal growth solution 2 with a saturation point of 40° C.;

(6) placing the crystal carrier 3 mounted with the long-seed KDP crystal 13 into an oven for preheating for 7 hours, wherein the preheating temperature is 40° C.;

(7) after finishing preheating, placing the crystal carrier 3 mounted with the long-seed KDP crystal 13 into the prepared KDP growth solution 2, connecting the connecting rod 6 of the crystal carrier 3 to the rotating shaft 4 of the motor 5, starting the motor 5, and setting a rotating speed range to be 30 rpm; wherein the rotation mode adopts a cycle of forward rotation 25 s-deceleration 2 s-stop 1 s-reverse acceleration 2 s-reverse rotation 25 s-deceleration 2 s-stop 1 s-forward acceleration 2 s, and s represents second; and (8) heating the KDP growth solution 2 to 50° C. for superheating treatment, so that the four side surfaces of the long-seed KDP crystal 13 are completely dissolved but are not broken, then cooling to allow the supersaturation degree of the KDP growth solution 2 to be always 15%, thereby realizing the pyramidal growth of the KDP crystal on the long-seed KDP crystal 13 and obtaining the KDP crystal 14.

Figure 4:
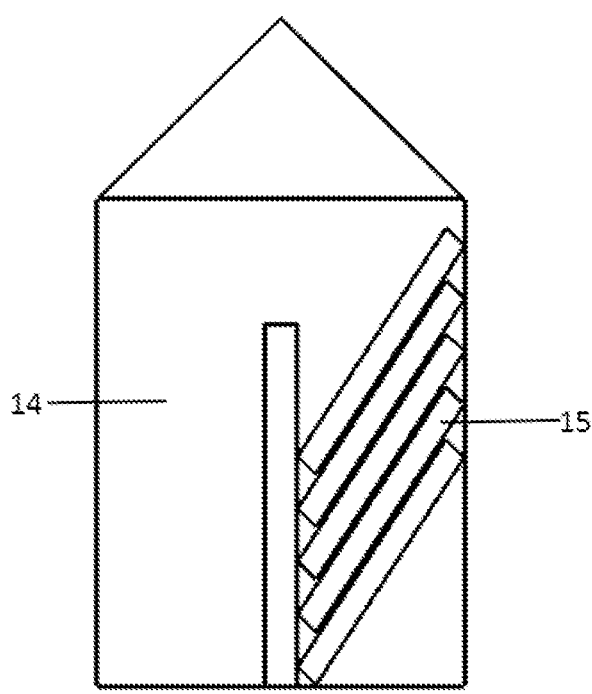
FIG. 4 shows cutting a plurality of third harmonic generation element from the KDP-type crystal grown by the pyramidal growth method for long-seed KDP-type crystal of the present invention.

In particular, as shown in FIG. 4, when a third harmonic generation element 15 is cut, the matching angle of the KDP crystal 14 is 60° and the azimuth angle is 0° or 90°, so that each part of the grown KDP crystal 14 which is divided into two can cut approximately square third harmonic generation element 15 exactly along the [100] direction and at an angle of 30° with the direction, with high cutting efficiency; furthermore, the size of these cut-out approximately square third harmonic generation elements 15 is exactly approximately equal to the size of the horizontal cross-section of the grown KDP crystal 14.

Example 2: Pyramidal Growth for Long-Seed DKDP Crystal with 30% Deuteration Rate The pyramidal growth for a long-seed DKDP crystals with 30% deuteration rate includes the following steps in connection with FIGS. 1, 2, and 3A to 3E:

(1) manufacturing a growth tank 1 for crystal growth, wherein a motor 5 is arranged at the upper part of the growth tank 1, and a connecting rod 6 of a crystal carrier 3 is connected to a lower end of a rotating shaft 4 of the motor 5;

(2) manufacturing the crystal carrier 3 for crystal growth: wherein the crystal carrier 3 comprises an upper cross beam 7, a lower tray 12, the connecting rod 6, supporting side rods 8 and 9, and two blade-like stirring paddles 10 and 11; the upper cross beam 7 is a smooth-edged batten; the connecting rod 6 is a hollow round rod fixed at the center of the upper cross beam 7; the lower tray 12 is round plate; lower ends of the supporting side rods 8 and 9 are welded at two ends of the lower tray 12 with the same diameter, and upper ends of the supporting side rods 8 and 9 are welded at two ends of the upper cross beam 7; the blade-like stirring paddles 10 and 11 are of blade-like structures welded on the supporting side rods 8 and 9; the two blade-like stirring paddles 10 and 11, the supporting side rods 8 and 9 and the upper cross beam 7 are arranged on the same vertical plane; the center of the upper surface of the lower tray 12 is a fixed position of the long-seed crystal; and all joints are smoothly connected to ensure smoothness;

(3) manufacturing a long-seed DKDP crystal 13 with [001] in height direction: wherein the height of the long-seed DKDP crystal 13 is smaller than the height of the supporting side rods 8 and 9 of the crystal carrier 3, and the horizontal length and the width range of the long-seed DKDP crystal 13 are 10 mm;

(4) mounting the lower end surface of the long-seed DKDP crystal 13 in the center of the upper surface of the lower tray 12 of the crystal carrier 3;

(5) preparing a DKDP crystal growth solution 2 with a saturation point of 55° C.;

(6) placing the crystal carrier 3 mounted with the long-seed DKDP crystal 13 into an oven for preheating for 4 hours, wherein the preheating temperature is 55° C.;

(7) after finishing preheating, placing the crystal carrier 3 mounted with the long-seed DKDP crystal 13 into the prepared DKDP growth solution 2, connecting the connecting rod 6 of the crystal carrier 3 to the rotating shaft 4 of the motor 5, starting the motor 5, and setting a rotating speed range to be 10 rpm; wherein the rotation mode adopts a cycle of forward rotation 25 s-deceleration 2 s-stop 1 s-reverse acceleration 2 s-reverse rotation 25 s-deceleration 2 s-stop 1 s-forward acceleration 2 s, and s represents second; and (8) heating the DKDP growth solution 2 to 60° C. for superheating treatment, so that the four side surfaces of the long-seed DKDP crystal 13 are completely dissolved but are not broken, then cooling to allow the supersaturation degree of the DKDP growth solution 2 to be always 5%, thereby realizing the pyramidal growth of the DKDP crystal on the long-seed DKDP crystal 13 and obtaining the DKDP crystal 14.

In particular, as shown in FIG. 4, when a third harmonic generation element 15 is cut, the matching angle of the DKDP crystal 14 is 59° 5' and the azimuth angle is 0° or 90°, so that each part of the grown DKDP crystal 14 which is divided into two can cut approximately square third harmonic generation element 15 exactly along the [100] direction and at an angle of 30° 5' with the [001] direction, with high cutting efficiency; furthermore, the size of these cut-out approximately square third harmonic generation elements 15 is exactly approximately equal to the size of the horizontal cross-section of the grown DKDP crystal 14.

Example 3: Pyramidal Growth for Long-Seed DKDP Crystal with 70% Deuteration Rate The pyramidal growth for a long-seed DKDP crystals with 70% deuteration rate includes the following steps in connection with FIGS. 1, 2 and 3A to 3E:

(1) manufacturing a growth tank 1 for crystal growth, wherein a motor 5 is arranged at the upper part of the growth tank 1, and a connecting rod 6 of a crystal carrier 3 is connected to a lower end of a rotating shaft 4 of the motor 5;

(2) manufacturing the crystal carrier 3 for crystal growth: wherein the crystal carrier 3 comprises an upper cross beam 7, a lower tray 12, the connecting rod 6, supporting side rods 8 and 9, and two blade-like stirring paddles 10 and 11; the upper cross beam 7 is a smooth-edged batten; the connecting rod 6 is a hollow round rod fixed at the center of the upper cross beam 7; the lower tray 12 is round plate; lower ends of the supporting side rods 8 and 9 are welded at two ends of the lower tray 12 with the same diameter, and upper ends of the supporting side rods 8 and 9 are welded at two ends of the upper cross beam 7; the blade-like stirring paddles 10 and 11 are of blade-like structures welded on the supporting side rods 8 and 9; the two blade-like stirring paddles 10 and 11, the supporting side rods 8 and 9 and the upper cross beam 7 are arranged on the same vertical plane; the center of the upper surface of the lower tray 12 is a fixed position of the long-seed crystal; and all joints are smoothly connected to ensure smoothness;

(3) manufacturing a long-seed DKDP crystal 13 with [001] in height direction: wherein the height of the long-seed DKDP crystal 13 is smaller than the height of the supporting side rods 8 and 9 of the crystal carrier 3, and the horizontal length and the width range of the long-seed DKDP crystal 13 are 15 mm;

(4) mounting the lower end surface of the long-seed DKDP crystal 13 in the center of the upper surface of the lower tray 12 of the crystal carrier 3;

(5) preparing a DKDP crystal growth solution 2 with a saturation point of 70° C.;

(6) placing the crystal carrier 3 mounted with the long-seed DKDP crystal 13 into an oven for preheating for 12 hours, wherein the preheating temperature is 70° C.;

(7) after finishing preheating, placing the crystal carrier 3 mounted with the long-seed DKDP crystal 13 into the prepared DKDP growth solution 2, connecting the connecting rod 6 of the crystal carrier 3 to the rotating shaft 4 of the motor 5, starting the motor 5, and setting a rotating speed range to be 50 rpm; wherein the rotation mode adopts a cycle of forward rotation 25 s-deceleration 2 s-stop 1 s-reverse acceleration 2 s-reverse rotation 25 s-deceleration 2 s-stop 1 s-forward acceleration 2 s, and s represents second; and (8) heating the DKDP growth solution 2 to 85° C. for superheating treatment, so that the four side surfaces of the long-seed DKDP crystal 13 are completely dissolved but are not broken, then cooling to allow the supersaturation degree of the DKDP growth solution 2 to be always 10%, thereby realizing the pyramidal growth of the DKDP crystal on the long-seed DKDP crystal 13 and obtaining the DKDP crystal 14.

In particular, as shown in FIG. 4, when a third harmonic generation element 15 is cut, the matching angle of the DKDP crystal 14 is 59°4' and the azimuth angle is 0° or 90°, so that each part of the grown DKDP crystal 14 which is divided into two can cut approximately square third harmonic generation element 15 exactly along the [100] direction and at an angle of 30°6' with the [001] direction, with high cutting efficiency; furthermore, the size of these cut-out approximately square third harmonic generation elements 15 is exactly approximately equal to the size of the horizontal cross-section of the grown DKDP crystal 14.

In summary, in the present invention, because the growth process is that four prismatic faces with highly similar growth environments grow at the same time and stirring is applied by blade-like stirring paddles during the crystal growth process, the cut optical elements have high optical uniformity. Due to the unique characteristic of the cutting angle of the KDP-type crystal third harmonic generation element, the crystal grown by the method has high cutting efficiency when the third harmonic generation element is cut, and the area of the largest third harmonic generation element capable of being cut can be known in advance through the size of the horizontal size of the grown crystal.

We claim:

1. A method for growing pyramidal long-seed KDP-type crystal, comprising:
    (1) manufacturing a growth tank for crystal growth, wherein a motor is arranged at an upper part of the growth tank, and a connecting rod of a crystal carrier is connected to a lower end of a rotating shaft of the motor;
    (2) manufacturing the crystal carrier for crystal growth, wherein the crystal carrier comprises an upper cross beam, a lower tray, the connecting rod, supporting side rods, and two blade-like stirring paddles; the connecting rod is fixed at a center of the upper cross beam; lower ends of the supporting side rods are fixed at two ends of the lower tray with same diameter, and upper ends of the supporting side rods are fixed at two ends of the upper cross beam; the blade-like stirring paddles are of blade-like structures fixed on the supporting side rods; the two blade-like stirring paddles, the supporting side rod, s and the upper cross beam are arranged on the same vertical plane; center of upper surface of the lower tray is a fixed position of a long-seed crystal; and all joints are smoothly connected to ensure smoothness;
    (3) manufacturing the long-seed crystal with [001] direction in height direction, wherein height of the long-seed crystal is smaller than height of the supporting side rods of the crystal carrier, and horizontal length and width range of the long-seed crystal are 5-15 mm;
    (4) mounting the lower end surface of the long-seed crystal in the center of the upper surface of the lower tray of the crystal carrier;
    (5) preparing a crystal growth solution with a saturation point of 40 to 70° C.;
    (6) placing the crystal carrier mounted with the long-seed crystal into an oven for preheating for 4 to 12 hours, wherein preheating temperature is the saturation point temperature of the growth solution;
    (7) placing the crystal carrier mounted with the long-seed crystal into the prepared growth solution, connecting the connecting rod of the crystal carrier to a rotating shaft of the motor, starting the motor at a rotating speed in a range of 10-50 rpm and in a rotation mode wherein a cycle is sequentially performed by forward rotation for 25 seconds, deceleration for 2 seconds, stop for 1 second, reverse acceleration for 2 seconds, reverse rotation for 25 seconds, deceleration for 2 seconds, stop for 1 second, and forward acceleration for 2 seconds; and
    (8) heating the growth solution to 5 to 15° C. above the saturation point temperature for superheating treatment to completely dissolve but not breaking the four side surfaces of the long-seed crystal, cooling to allow the supersaturation degree of the growth solution to be between 5-15%, thereby realizing the pyramidal growth of the crystal on the long-seed crystal and obtaining the KDP-type crystal.

2. The method according to claim 1, wherein the upper cross beam is a smooth-edged batten, the connecting rod is a hollow round rod, and the lower tray is a round plate in step (2).

3. The method according to claim 1, wherein the fixing mode is welding in step (2).

4. The method according to claim 1, wherein the KDP-type crystal is a KDP crystal or a DKDP crystal.

* * * * *